United States Patent [19]

Brody

[11] 4,236,938

[45] Dec. 2, 1980

[54] EFFICIENT HIGH VOLTAGE PHOTOVOLTAIC CELLS

[75] Inventor: Philip S. Brody, Brookmont, Md.

[73] Assignee: The United States of America as represented by the Secretary of the Army, Washington, D.C.

[21] Appl. No.: 60,525

[22] Filed: Jul. 25, 1979

Related U.S. Application Data

[60] Continuation-in-part of Ser. No. 784,761, Apr. 15, 1977, Pat. No. 4,160,927, which is a division of Ser. No. 533,365, Dec. 16, 1974, Pat. No. 4,051,465, which is a continuation-in-part of Ser. No. 411,853, Nov. 1, 1973, Pat. No. 3,855,004.

[51] Int. Cl.$^3$ ............................................. H01L 31/00
[52] U.S. Cl. ............................................. 136/254
[58] Field of Search ..................... 136/89 SP; 310/306, 310/357, 358

[56] References Cited

U.S. PATENT DOCUMENTS

| | | | |
|---|---|---|---|
| 3,100,291 | 8/1963 | Abbott | 340/10 |
| 3,458,915 | 8/1969 | Miller et al. | 310/358 X |
| 3,975,632 | 8/1976 | Glass et al. | 250/212 |
| 4,058,729 | 11/1977 | Sher | 250/370 |

Primary Examiner—Howard S. Williams
Assistant Examiner—William Leader
Attorney, Agent, or Firm—Nathan Edelberg; Robert P. Gibson; Saul Elbaum

[57] ABSTRACT

A photovoltaic cell comprised of a plurality of single crystal, remanently polarized, ferroelectric layers in a stack with electrodes affixed to each end. Additionally, electrodes are disposed between adjacent layers or conductive or semi-conductive regions are formed at and near the interfaces between layers by chemical reduction or doping. The cell has a higher conversion efficiency than ferroelectric cells heretofore known.

11 Claims, 8 Drawing Figures

U.S. Patent Dec. 2, 1980 Sheet 1 of 2 4,236,938
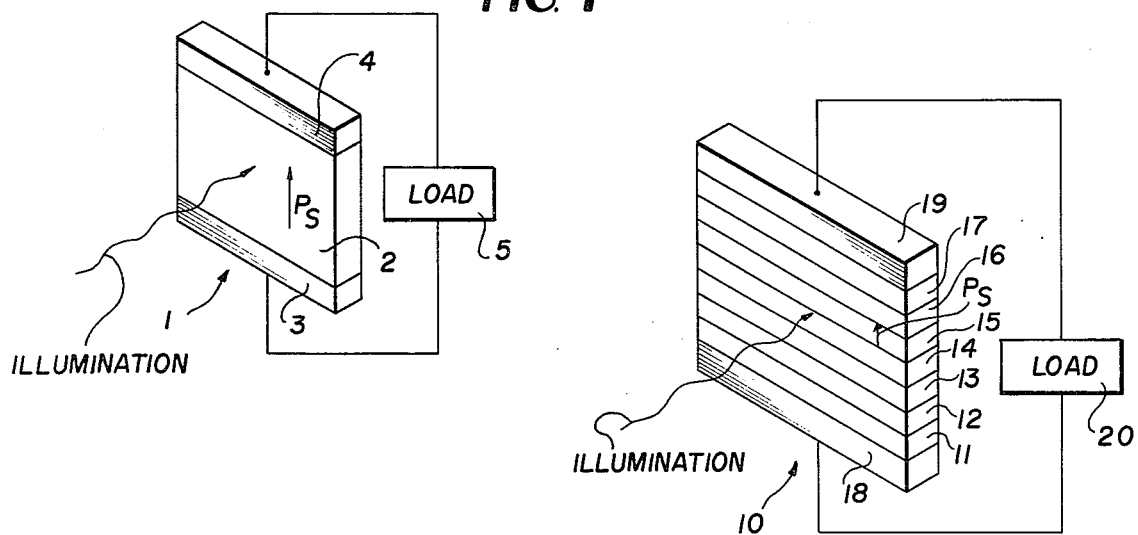
FIG. 1
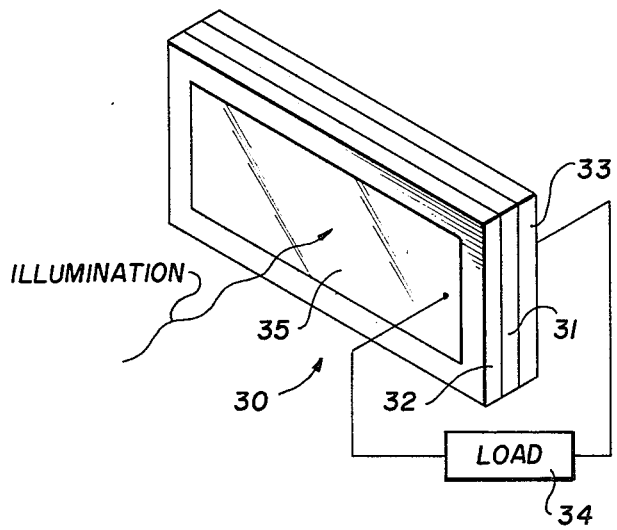
FIG. 2
FIG. 3
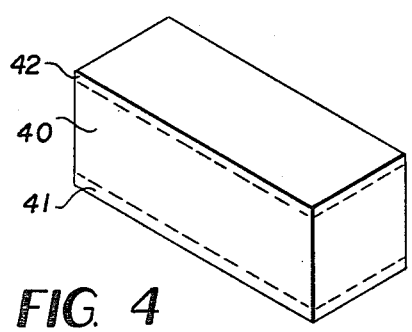
FIG. 4
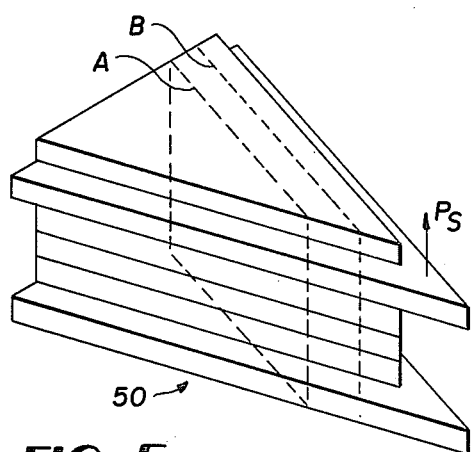
FIG. 5

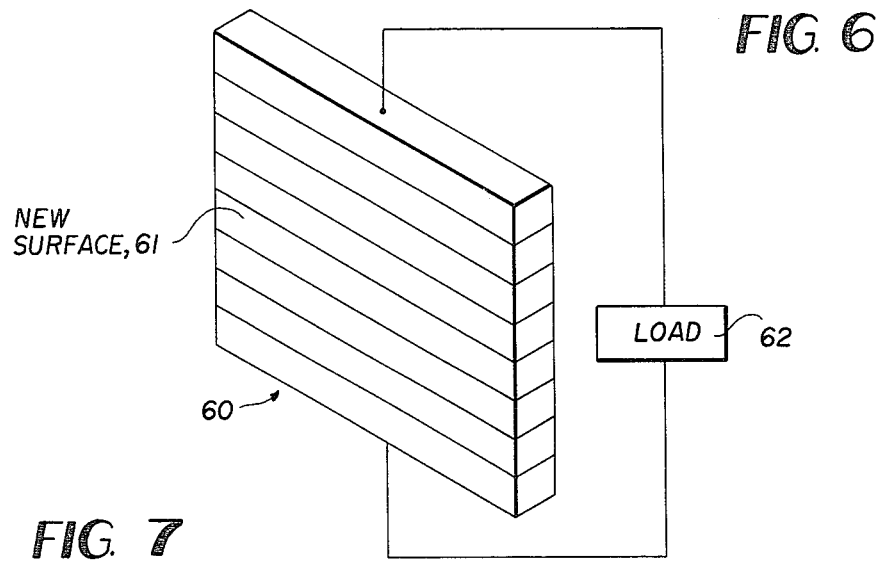
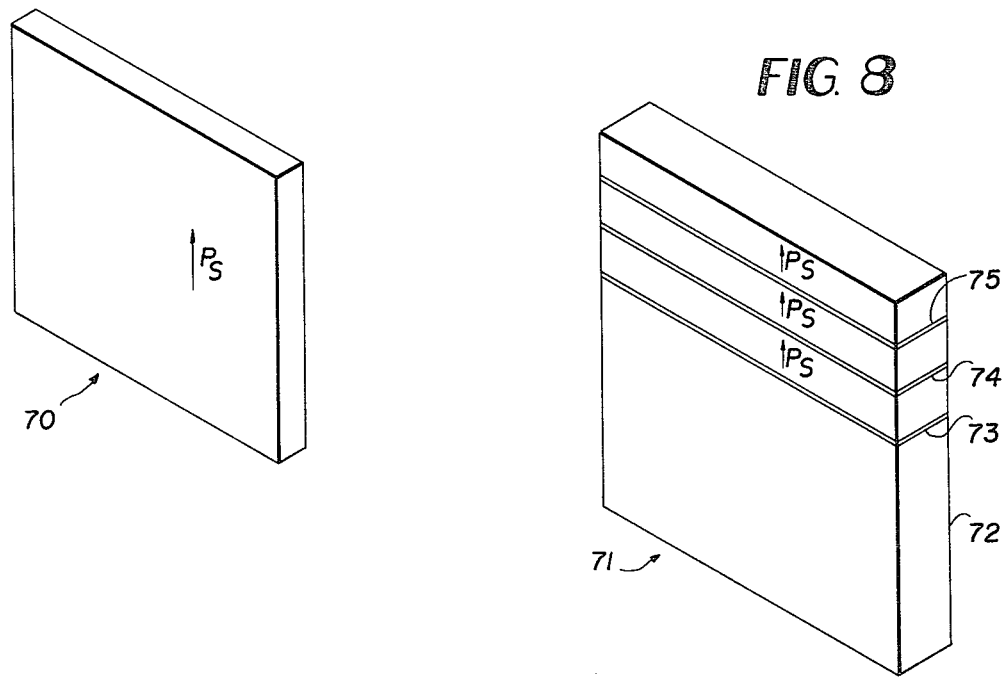

EFFICIENT HIGH VOLTAGE PHOTOVOLTAIC CELLS

RIGHTS OF THE GOVERNMENT

The invention described herein may be manufactured, used, and licensed by or for the United States Government for governmental purposes without the payment to me of any royalty thereon.

The present application is a continuation-in-part of U.S. patent application Ser. No. 784,761, filed Apr. 15, 1977, now U.S. Pat. No. 4,160,927, which is a division of application Ser. No. 533,365, filed Dec. 16, 1974, now U.S. Pat. No. 4,051,465, which is a continuation-in-part of application Ser. No. 411,853, filed Nov. 1, 1973, now U.S. Pat. No. 3,855,004.

The present invention is directed to an improved photovoltaic cell.

U.S. Pat. No. 3,855,004 is directed to a photovoltaic cell which is comprised of a poled polycrystalline photovoltaic ferroelectric material having electrodes affixed thereto. While this cell is an improvement over known ferroelectric devices, the magnitude of the voltages and the conversion efficiency of the cell are somewhat limited.

As is generally recognized, for use as an energy conversion device, it is desired that a photovoltaic cell operate with as high an efficiency as possible and produce the largest possible voltage and/or current for a given light input.

It is thus an object of the present invention to provide a photovoltaic cell made of ferroelectric material which produces higher output voltages, and has a higher conversion efficiency than has heretofore been possible.

It is a further object of the invention to provide such a photovoltaic cell which is sensitive over a large spectral range.

The above objects are accomplished by providing a cell which is comprised of a plurality of laminar stacked plates or layers of single crystal ferroelectric material, all of which are remanently polarized in the same direction. Conductive or semi-conductive charge compensation regions are provided in the vicinity of the laminar boundaries which separate adjacent layers and electrodes are affixed to the end layers. The layers may be very thin and the voltages produced by all of the layers are additive. Greater conversion efficiency is obtained than with the polycrystalline cell discussed above largely because of the increased quantum efficiency of the single crystal material, and high voltages may be achieved by stacking the layers of single crystal material.

The invention will be better understood by referring to the following drawings in which:

FIG. 1 is an illustration of the cell disclosed in U.S. Pat. No. 3,855,004.

FIG. 2 is an illustration of an embodiment of the present invention.

FIG. 3 is an illustration of a further embodiment of the present invention.

FIG. 4 is an enlarged illustration of a single laminar plate or layer of a photovoltaic cell of the present invention.

FIG. 5 is an illustration depicting one technique for making a photovoltaic cell according to the present invention.

FIG. 6 is an illustration of a photovoltaic cell made by the technique illustrated in FIG. 5.

FIG. 7 is an illustration of a piece of bulk ferroelectric material, from which a photovoltaic cell according to the present invention can be fabricated.

FIG. 8 is an illustration of a cell according to the present invention which can be fabricated from the bulk material illustrated in FIG. 7.

FIG. 1 is an illustration of the above mentioned photovoltaic cell disclosed in U.S. Pat. No. 3,855,004. It is comprised of a substrate of polycrystalline ferroelectric ceramic material 2 having electrodes 3 and 4 affixed to the ends thereof. The ferroelectric ceramic material is polarized in the direction $P_s$ as shown in the figure, and when the cell is illuminated it produces a voltage across the electrodes, and a current flows through load 5. Typical ceramics which may be utilized for substrate 2 are $BaTiO_3$ ceramic, and ceramics of mixed oxides such as $PbTiO_3$-$PbZrO_3$ with and without additives. For a full disclosure of possible materials which can be used, the reader is referred to U.S. Pat. No. 3,855,004.

The performance of the device illustrated in FIG. 1 may be described by certain parameters including the short circuit current per unit width per watt of illumination ($i_{osc}$), the open circuit photo-emf per unit width ($V_{oc}$), and the conversion efficiency, which is defined as the ratio of the total electric energy outputted to the total light energy inputted.

The best values which have been obtained experimentally for $i_{osc}$, $V_{oc}$, and conversion efficiency are $0.1 \times 10^{-6}$ A-cm/W, 1500 V/cm, and 0.04% respectively. These results were obtained for illumination in the near ultraviolet range (approximately 380 nm) with the cell output and conversion efficiency decreasing for longer wavelengths.

An embodiment of a cell according to the present invention is shown in FIG. 2. The cell is built up of a plurality of laminar plates or layers shown as elements 11–17 in the Figure, but in an actual embodiment not limited to 7 elements but being any arbitrary number. Each of the layers is comprised of a thin slab of single crystal ferroelectric material and theoretically any single crystal version of the polycrystalline ferroelectric materials disclosed in U.S. Pat. No. 3,855,004 may be used. Each of the layers is remanently polarized in a direction perpendicular to the faces of the layer, for example in the direction $P_s$ shown in FIG. 2. The polarization charge is compensated at charge compensation regions in the vicinity of the laminar boundaries separating adjacent layers, for example at regions 41 and 42 of layer 40 shown in FIG. 4.

Adjacent stacked layers of the cell may either be separated by electrodes which are plated or otherwise applied to opposing faces of each layer, or the faces themselves may be chemically reduced or doped so as to become conductive or semi-conductive. The electrodes could for example be made of fired silver, indium oxide or evaporated metal thin film and the reduction would be accomplished by heating the opposing faces in an oxygen-free atmosphere. The charge compensation regions referred to above are situated adjacent to the electrodes or adjacent or in the reduced or doped areas.

When illumination is applied to the cell, a voltage is generated across electrodes 18 and 19 and a current is fed through load 20. Actually, each individual layer generates a photovoltage, and these voltages are in series with each other so that the sum of all of the voltages so produced appears across electrodes 18 and 19.

Down to a certain minimum thickness (beneath 0.001 inch but not yet determined) the photovoltage produced by each layer is independent of thickness. Thus a layer 0.1 inch thick produces the same photovoltage as a layer 0.2 inches thick. This allows a high voltage to be produced because the layers can be made very thin and many stacked layers can be used to build up a cell.

As mentioned above, the device operates at a significantly higher conversion efficiency than the cell shown in FIG. 1, and is capable of producing significantly higher output currents. For instance, it is contemplated that the conversion efficiency will be at least several tenths of a percent to several percent and that current outputs of $1 \times 10^{-6}$ A-cm/W can be obtained. Based on theoretical calculations which have been performed it is believed that maximum efficiency can approach 25 percent.

This makes the device of the present invention significantly more suitable as an energy conversion device than ferroelectric cells heretofore known. Further, the cell could be used to store information for memory applications such as a laser beam accessed memory, and would produce larger output currents than the presently available ceramic material, thus resulting in faster memories.

A further embodiment of the invention is shown in FIG. 3, which is essentially the same structure as shown in FIG. 2, except with the illumination oriented parallel instead of perpindicular to the direction of remanent polarization, and additionally using a transparent electrode. Thus, FIG. 3 shows cell 30 having single crystal ferroelectric layers 31, 32 and 33, and additionally having transparent electrode 35 as well as an opposing electrode (not shown). The remanent polarization in each of layers 31, 32 and 33 is oriented perpendicular to the faces of those layers, and thus parallel to the direction of the incident illumination shown in the Figure. Electrodes or reduced regions are provided between adjacent layers, and again, the incident illumination causes a photovoltage to be generated across the electrodes, and a current to be fed through the load 34.

A number of techniques may be used to fabricate cells such as shown in FIGS. 2 and 3. The following methods are possible:

(1) Laminar single crystals with spontaneous polarization directed perpindicular to laminar planes can be grown. For example, flux grown, $BaTiO_3$ butterflies, produced by the "Remeika method" can be utilized. Such butterflies can be plated with electrodes, poled with an applied electric field, and assembled together in a stack with a conductive bonding agent as shown in FIG. 5. The stacks can then be sliced into sheets with plane surfaces perpendicular to the laminar surfaces to produce cells such as shown in FIG. 2 and again in FIG. 6. For barium titanate, the ferroelectric layers would be less than 0.001 inches thick.

(2) Bulk single crystals can be grown, for example by the flame fusion process, and then can be sliced, polished, and ground to small laminar thicknesses to form the ferroelectric layers. After chemical reduction of the surface regions to produce the semi-conductive areas, the layers can be poled, and stacked to produce units as shown in FIG. 3, or stacked and sliced again to produce units as shown in FIG. 2.

(3) Crystals can be grown epitaxially on a good laminar base either of the same ferroelectric material as the crystal or on a different material. Then, conductive or semi-conductive regions can be introduced by reduction or doping of the bulk material and the crystal can then be grown again, the conductive or semi-conductive regions introduced again, and so on until a device of desired size is built up.

(4) A unit of bulk ferroelectric material which is remanently polarized, such as is shown in FIG. 7, can be modified to produce a photovoltaic cell by the introduction of conductive or semi-conductive regions at spaced intervals. FIG. 8 shows bulk material 72 having semi-conductive regions 73, 74 and 75 introduced. These regions can be introduced by known lithographic techniques in conjunction with either reduction, ion implantation, or sputtering techniques. The precise details of such techniques as well as those described above are within the state of the art of semiconductor fabrication technology.

There thus has been described a novel photovoltaic cell as well as possible fabrication techniques for the cell. As discussed above, the cell produces higher voltages and has a higher conversion efficiency than ferroelectric cells heretofore known.

I wish it to be understood that I do not desire to be limited to the exact details of construction shown and described, for obvious modifications can be made by a person skilled in the art.

I claim:

1. A high efficiency photovoltaic cell comprised of a plurality of single crystal laminar ferroelectric material layers stacked between two electrodes, each said layer having two opposing faces and said layers being stacked with respective faces of adjacent layers facing each other, each said layer being remanently polarized in the same direction perpendicular to said faces, said layers being exposed to incident light whereby said light is converted to electrical energy by said photovoltaic cell.

2. The photovoltaic cell of claim 1 wherein each layer has a charge compensating region in areas adjacent each of its faces.

3. The photovoltaic cell of claim 2 wherein said layers are discrete layers and wherein adjacent layers have electrodes disposed therebetween.

4. The photovoltaic cell of claim 2 wherein said layers are discrete layers and wherein each layer has a reduced region near each of its faces which is adjacent to another layer of ferroelectric material.

5. The photovoltaic cell of claim 2 wherein all of said layers are part of the same block of single crystal material, and wherein adjacent layers have conductive or semi-conductive regions disposed therebetween at least up to a certain depth.

6. The photovoltaic cell of claim 2 in combination with a source of illumination, said cell and source being relatively oriented so that the direction of incidence of said illumination is approximately perpendicular to the direction of said remanent polarization.

7. The photovoltaic cell of claim 2 wherein at least one of said electrodes is transparent, in combination with a source of illumination, said cell and source being relatively oriented so that the direction of incidence of said illumination is approximately parallel to the direction of said remanent polarization.

8. The photovoltaic cell of claim 2 which is made by growing individual single crystal butterflies, applying electrodes to said butterflies, poling said butterflies, cementing them into a stack with a conductive bonding agent, and cutting the stacked butterflies at two planes to form a cell in the shape of a rectangular parrallelepiped.

9. The photovoltaic cell of claim 2 which is made by growing a single bulk crystal, slicing it into layers, making the opposite faces of said layers conductive or semiconductive, poling said layers, and cementing them into a stack with a conductive bonding agent.

10. The photovoltaic cell of claim 2 which is made by a process including epitaxial deposition of the single crystal layers on a laminar base.

11. The photovoltaic cell of claim 2 which is made by growing a single bulk crystal and introducing semiconductive regions between adjacent layers to a depth equal to at least the illumination absorption depth.

* * * * *